(12) United States Patent
Jerominek

(10) Patent No.: US 6,201,243 B1
(45) Date of Patent: Mar. 13, 2001

(54) MICROBRIDGE STRUCTURE AND METHOD FOR FORMING THE MICROBRIDGE STRUCTURE

(75) Inventor: Hubert Jerominek, Ste-Foy (CA)

(73) Assignee: Institut National d'Optique, Sainte-Foy (CA)

( * ) Notice: Subject to any disclaimer, the term of this patent is extended or adjusted under 35 U.S.C. 154(b) by 0 days.

(21) Appl. No.: 09/119,486

(22) Filed: Jul. 20, 1998

(51) Int. Cl.$^7$ ..................................................... H01L 31/18
(52) U.S. Cl. ..................... 250/338.1; 250/338.4; 250/332
(58) Field of Search ............................. 250/338.4, 338.1, 250/332

(56) References Cited

U.S. PATENT DOCUMENTS

| | | | |
|---|---|---|---|
| 5,010,251 | 4/1991 | Grinberg et al. | 580/332 |
| 5,021,663 | 6/1991 | Hornbeck | 250/349 |
| 5,286,976 | 2/1994 | Cole | 250/349 |
| 5,288,649 | 2/1994 | Keenan | 437/3 |
| 5,300,915 | 4/1994 | Higashi et al. | 338/22 |
| 5,399,897 | 3/1995 | Cunningham et al. | 257/467 |
| 5,455,421 | * 10/1995 | Spears | 250/338.4 |
| 5,602,393 | 2/1997 | Gerard | 250/338.4 |
| 5,672,903 | 9/1997 | Butler et al. | 257/467 |
| 5,688,699 | 11/1997 | Cunningham et al. | 437/3 |
| 5,777,328 | * 7/1998 | Gooch | 250/332 |
| 5,831,266 | * 11/1998 | Jerominek et al. | 250/338.1 |

* cited by examiner

*Primary Examiner*—Constantine Hannaher
*Assistant Examiner*—Andrew Israel
(74) *Attorney, Agent, or Firm*—Merchant & Gould P.C.

(57) ABSTRACT

The microbridge structure comprises a substrate layer provided with two first electrical contacts; a microstructure including a sensing area provided with two second electrical contacts; and a micro support for suspending the microstructure over and at a predetermined distance from the substrate layer. The micro support has two electrically conductive paths made of electrically conductive layers. The two electrically conductive paths connect respectively the two first electrical contacts of the substrate layer to the two second electrical contacts of the microstructure. The micro support extends generally underneath the microstructure, between the microstructure and the substrate layer. The invention also relates to a method for forming the microbridge structure.

21 Claims, 18 Drawing Sheets

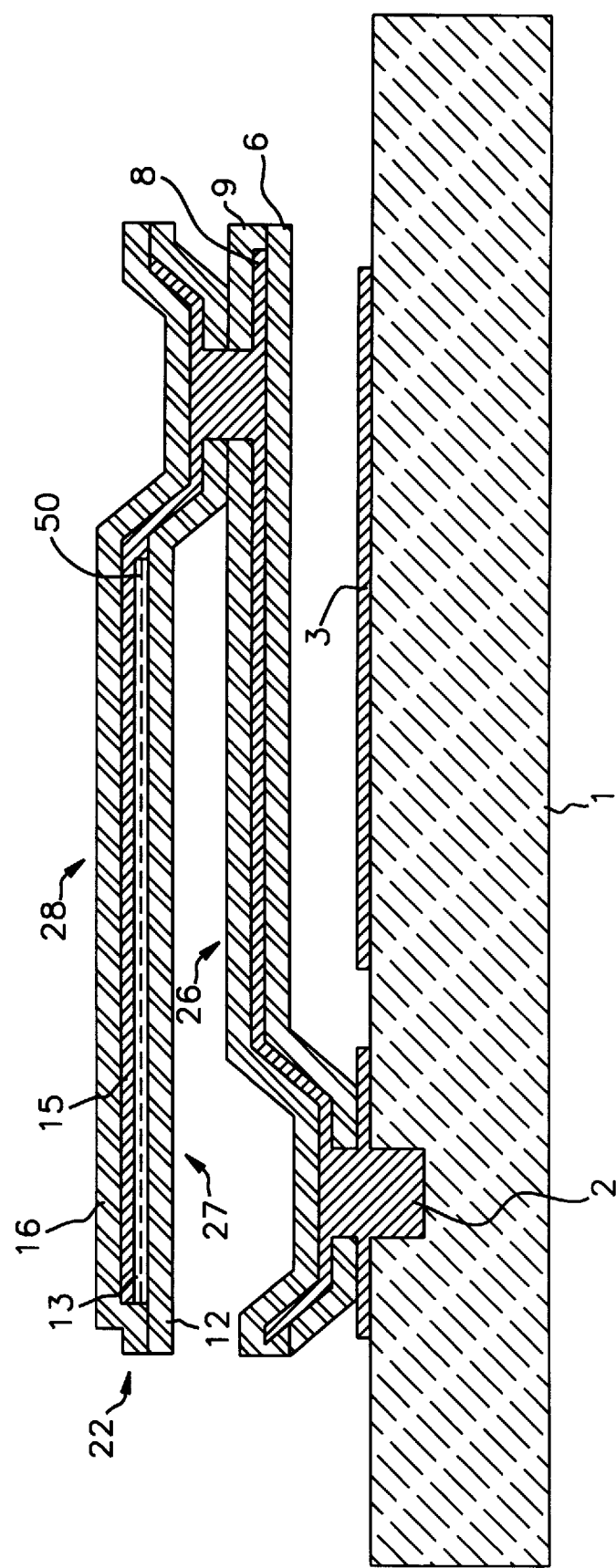

MICROBRIDGE STRUCTURE AND METHOD FOR FORMING THE MICROBRIDGE STRUCTURE

FIELD OF THE INVENTION

The present invention is concerned with a microbridge structure and a method for forming this microbridge structure. The invention relates to various types of micro sensors for environmental sensing including radiation, temperature, flow, and chemical sensors. More particularly, the invention relates to uncooled IR bolometric detectors.

BACKGROUND OF THE INVENTION

Known in the art, there is the U.S. Pat. No. 5,399,897 of B. T. Cunningham and P. V. Richard, describing a microstructure comprising a surface member and at least one leg, a proximate end of the leg being connected to a substrate and the distant end thereof being connected to the surface member. The leg is a multi layer leg comprising at least one dielectric layer and one electrically conductive layer.

Also known in the art, there are the U.S. Pat. No. 5,021,663 of L. J. Hornbeck and the U.S. Pat. No. 5,288,649 of W. F. Keenan. The supports described in these two patents are made entirely of metal or metal alloy films.

The following US patents also describe microstructures:

| U.S. Pat. No. | Issue Date | Inventor (s) |
| --- | --- | --- |
| 5,010,251 | Apr. 23, 1991 | Grinberg et al |
| 5,286,976 | Feb. 15, 1994 | Cole |
| 5,300,915 | Apr. 5, 1994 | Higashi et al |
| 5,602,393 | Feb. 11, 1997 | Gerard |
| 5,672,903 | Sept. 30, 1997 | Butler et al |
| 5,688,699 | Nov. 18, 1997 | Cunningham et al |

Figure 1:
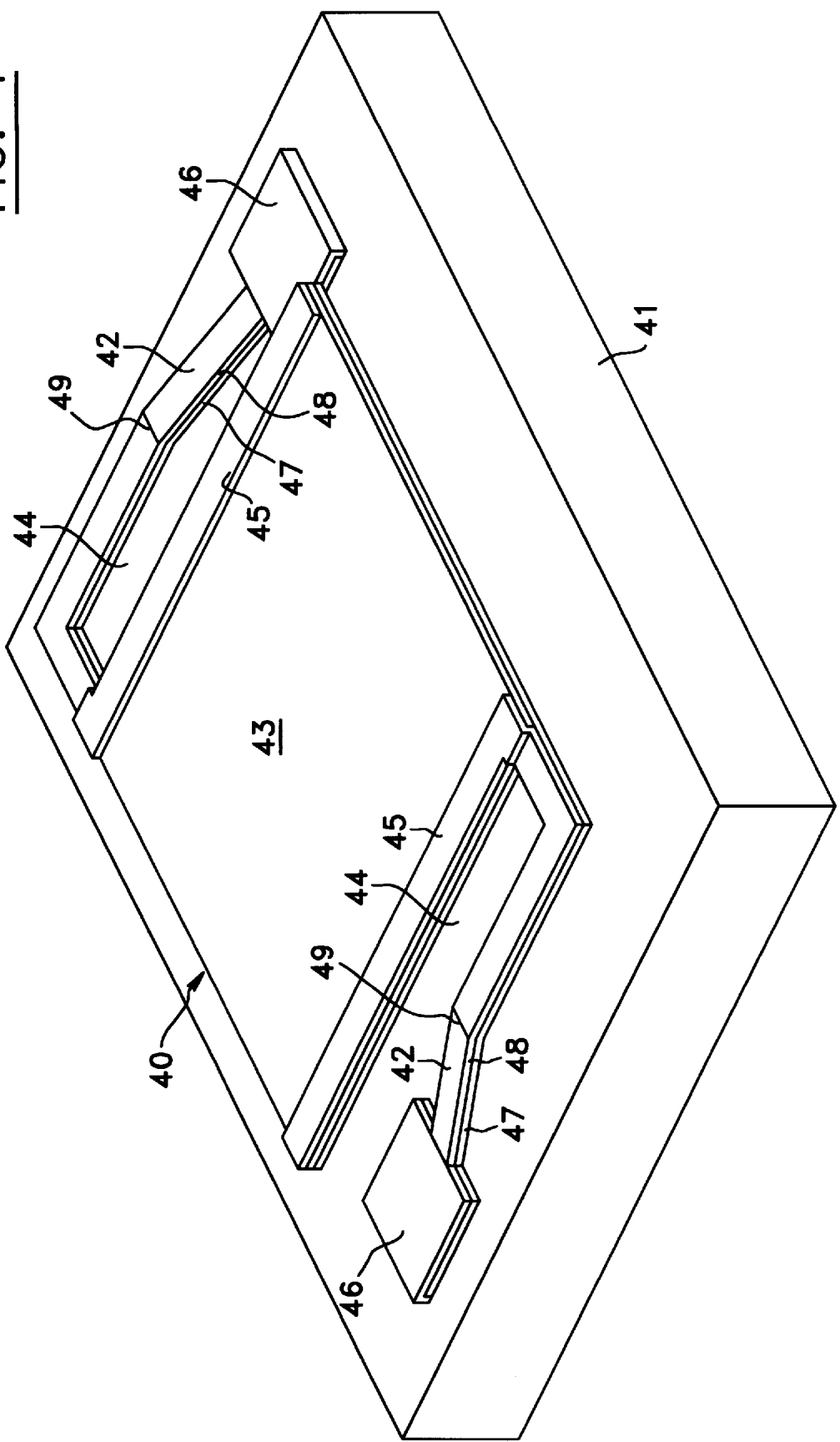

Referring now to FIG. 1, there is shown a perspective schematic view of a typical microbridge structure of the prior art. The microbridge structure shown in FIG. 1 consists of a microstructure 40 suspended over a substrate layer 41, and two inclined legs 42. The microstructure 40 provides a support for a sensing layer 43. The microstructure 40 is equipped with slots 44 cut through its entire thickness in order to elongate the path of heat conduction from the microstructure 40 to the substrate layer 41, and thus improving thermal isolation of this microstructure. The microstructure 40 is also equipped with a reticulated metal layer 45. The metal layer 45 partially overlapping the sensing layer 43 provides an electrically conductive path between the sensing layer 43 and the legs 42.

The legs 42 provide a support for the microstructure 40. The proximate ends of each leg are connected to the substrate layer 41 via electrical contact pads 46. The distant ends of the legs are connected to the microstructure 40. Each leg 42 is a multi layer leg consisting of a reticulated dielectric layer 47 and a reticulated electrically conductive layer 48 providing an electrically conductive path between the substrate layer 41 via contact pads 46 and the electrically conductive layer 45 of the microstructure 40 via contacts 49.

A drawback with the microbridge structures of the prior art is that when several microbridge structures are mounted side by side over a given area of the substrate layer 41 to form the sensitive surface, a portion of the area is needed to accommodate the legs of the microbridge structures. Such portion of the area that is needed to accommodate the legs is useless for sensing purposes and therefor limit the detecting capabilities of the microbridge structures.

An object of the present invention is to provide a microstructure bridge that can be used in a detector array made of several microstructure bridges mounted side by side within a given area to obtain a detector array with improved detecting capability.

Another object of the present invention is also to provided a method for making a microstructure bridge that can be used in a detector array made of several microstructure bridges mounted side by side within a given area to obtain a detector array with improved detecting capability.

SUMMARY OF THE INVENTION

According to the present invention, there is provided a microbridge structure comprising:

a substrate layer provided with two first electrical contacts;

a microstructure including a sensing area provided with two second electrical contacts; and a micro support for suspending the microstructure over and at a predetermined distance from the substrate layer, the micro support having two electrically conductive paths made of electrically conductive layers, the two electrically conductive paths connecting respectively the two first electrical contacts of the substrate layer to the two second electrical contacts of the microstructure, the micro support extending generally underneath the microstructure, between the microstructure and the substrate layer.

According to the present invention, there is also provided a method for forming a microbridge structure comprising microstructure suspended from a substrate layer by a micro support, the method comprising steps of:

(a) providing the substrate layer with two first electrical contacts;

(b) covering the substrate layer with a first temporary layer, and patterning and etching first cavities in the first temporary layer to provide accesses to the two first electrical contacts of the substrate layer;

(c) covering the layers of the previous steps (a) to (b) with a first electrically conductive layer, and patterning and etching the first electrically conductive layer to provide two first electrically conductive paths extending respectively from the two first electrical contacts, the two first electrically conductive paths being parts of the micro support;

(d) covering the layers of the previous steps (a) to (c) with a second temporary layer, and patterning and etching second cavities in the second temporary layer to provide accesses to the two second electrical contacts;

(e) covering the layers of the previous steps (a) to (d) with a sensing layer, and patterning and etching the sensing layer to define a sensing area located generally over the first electrically conductive paths;

(f) covering the layers of the previous steps (a) to (e) with a second electrically conductive layer, and patterning and etching the second electrically conductive layer to provide two second electrically conductive paths extending respectively from the two first electrically conductive paths to two electrical contacts of the sensing area, the second electrically conductive paths being parts of the micro support; and (g) removing the first and second temporary layers to reveal the micro support which extends generally underneath the microstructure, between the microstructure and the substrate layer.

DETAILED DESCRIPTION OF THE DRAWINGS

Referring again to FIG. 1, there is shown an embodiment of the prior art where the legs 42 supporting the suspended microstructure 40 are set apart from the microstructure 40. Such a positioning of the supporting legs increases significantly the total surface occupied by the microbridge structure and thus limits the total number of the microbridge structures that can be mounted side by side on the surface available for a detector array. Moreover, the positioning of the legs reduces the fill factor of the microbridge structure defined as a ratio of the surface of the sensing layer 43 to the surface covered by the microstructure 40 and the legs 42. Typically, the fill factor of the microstructure schematically shown in FIG. 1 does not exceed 60%. More the fill factor is low, more the performance of the detector using such microbridge structures is low. Also, the miniaturization of a detector using such microbridge microstructures is directly dependant upon the fill factor thereof, higher is the fill factor more the detector can be miniaturized.

Figure 2:
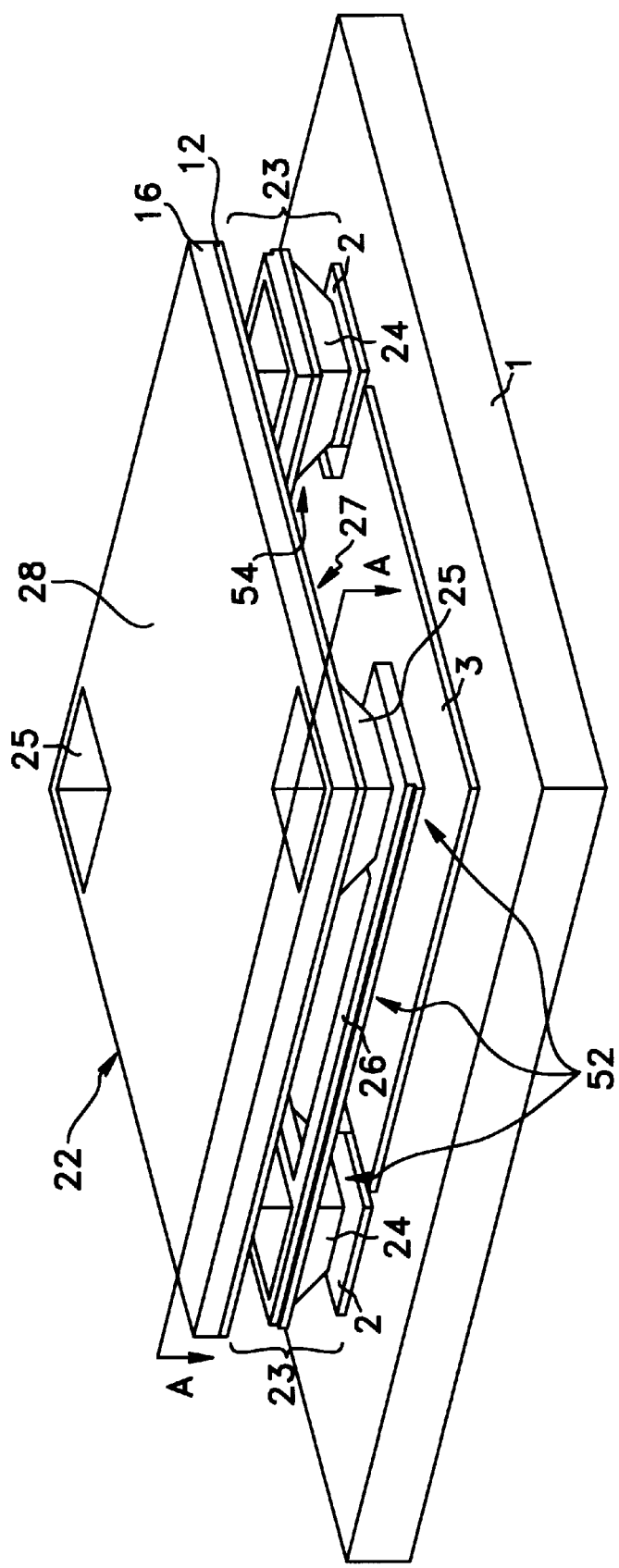
Figure 3:
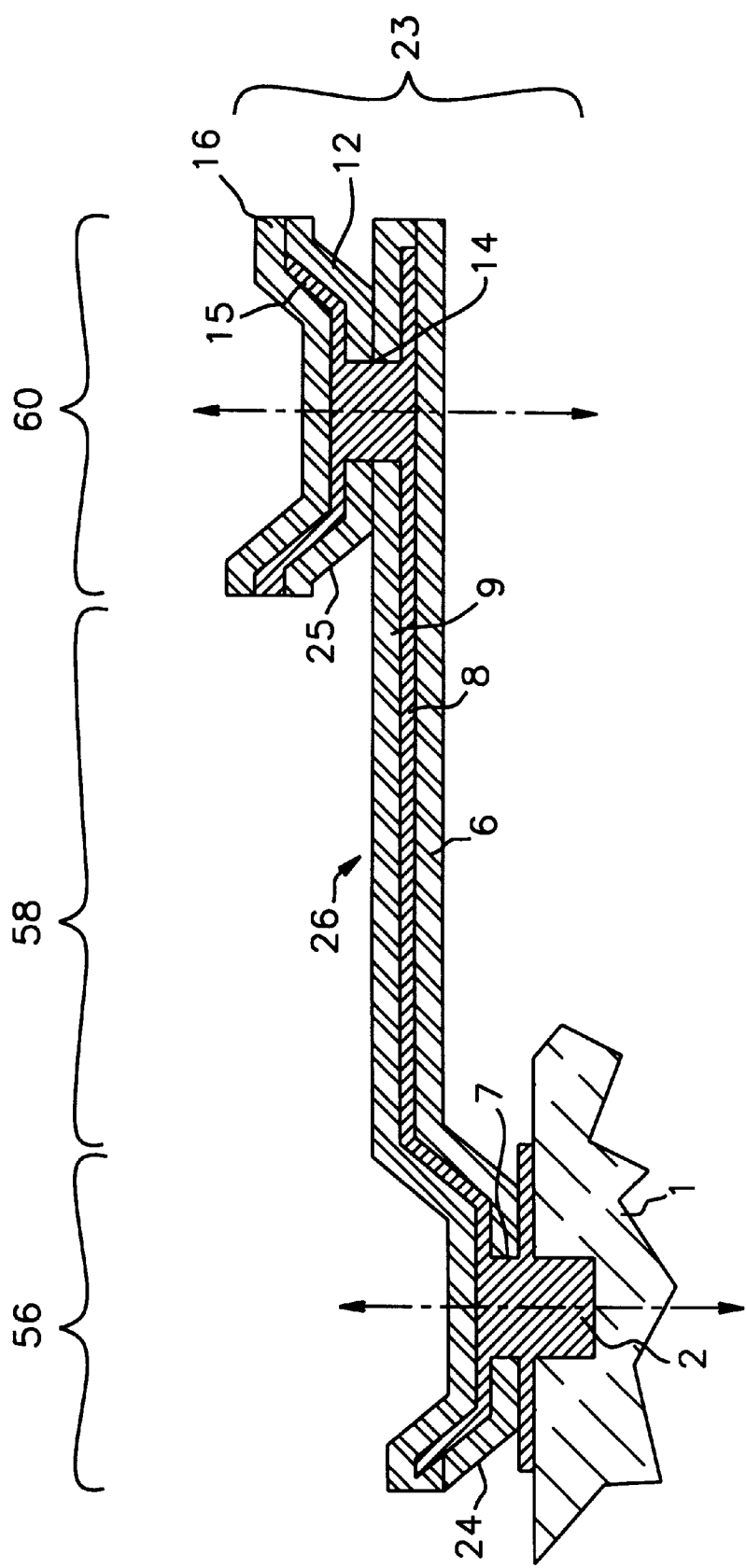

Referring now to FIGS. 2, 3 and 22, we will now describe a preferable embodiment of the microbridge structure according to the present invention, having a fill factor higher than that of the microbridge structures of the prior art. The microbridge structure according to the present invention comprises a substrate layer 1 provided with two electrical contacts 2, a microstructure 22 including a sensing layer 13 that forms a sensing area provided with two electrical contacts 50, and a micro support 23 for suspending the microstructure 22 over and at a predetermined distance from the substrate layer 1.

The micro support 23 has two electrically conductive paths. In the present preferable embodiment, each of the electrically conductive path is made of two electrically conductive layers 8 and 15. However, in an alternative embodiment, each electrically conductive path can be made of a single electrically conductive layer. The two electrically conductive paths connect respectively the two electrical contacts 2 of the substrate layer 1 to the two electrical contacts 50 of the microstructure 22. The micro support 23 extends generally underneath the microstructure 22, between the microstructure 22 and the substrate layer 1. Preferably, the micro support extends substantially entirely underneath the microstructure.

Preferably, the microbridge structure forms an uncooled infrared $VO_2$ based bolometric detector. The microstructure 22 is a suspended microstructure with sensing layer 13 such as an embedded $VO_2$ film. The sensing layer has characteristics for sensing a radiation with a given wavelength. Although the description is basically in terms of an individual microbridge structure, the invention equally applies to uni- and bi-dimensional multi-element arrays of such microstructures, for example arrays of the bolometric detectors.

The microbridge structure according to the present invention comprises a suspended microstructure 22 which is a planar micro platform supported by a single or a plurality of micro supports placed generally underneath the sensing area of the microstructure 22. This positioning of the micro supports maximizes the fill factor of the microbridge structure. In the case of the bolometric detectors, this fill factor is defined as a ratio of the sensing area actively participating in the infrared radiation absorption to the total surface of the bolometer microstructure. Due to the fact that the micro support 23 is generally located underneath the microstructure, bolometric detectors with the fill factors approaching 100% can be produced. This maximizes the bolometric detector performance and permits their miniaturization. While standard bolometric detectors have typically a surface of 50×50 $\mu m^2$, the microbridge structure according to the present invention permits to reduce the bolometer surface down to 25×25 $\mu m^2$ without much sacrifice in the device performance. The reduced surface bolometric detectors may be used to build uni-dimensional bolometric detector arrays consisting of up to 512×1 pixels and bi-dimensional bolometric detector arrays consisting of up to 480×640 pixels.

Preferably, the substrate layer 1 is a planar silicon wafer with a bolometer readout circuit (not shown) manufactured using conventional integrated circuit fabrication processing. This substrate layer 1 has electrical contacts 2 such as metal surface contact pads providing electrical connection between the electronic readout circuit (not shown) and the sensing layer 13 which forms a bolometric detector.

Preferably, the micro support 23 has two legs 52 and 54 each including lower, middle and upper portions 56, 58 and 60. The lower portions 56 of the legs 52 and 54 project respectively upwardly from the two electrical contacts 2 to first intermediate positions between the substrate layer 1 and the microstructure 22. The upper portions 60 of the legs 52 and 54 project respectively downwardly from the two electrical contacts 50 to second intermediate positions between the substrate layer 1 and the microstructure 22. The middle portions 58 of the legs 52 and 54 extend between the first and second intermediate positions as cantilevers 26 to connect respectively the corresponding lower and upper portions 56 and 60. The two legs 52 and 54 comprise respectively the two electrically conductive paths. Each of the electrically conductive paths is made of two electrically conductive layers 8 and 15.

Preferably, each of the legs 52 and 54 further comprises dielectric layers 6, 9, 12 and 16 embedding the electrically conductive layers 8 and 15 that connects the corresponding electrical contacts 2 and 50. Preferably, the lower and upper parts of each leg 52 or 54 are substantially shaped as an upside down hollow truncated pyramid.

The micro support 23 is placed generally underneath the microstructure 22. Each leg 52 or 54 of the micro support 23 comprises lower portion 56 which is a lower post connected to the substrate layer 1, upper portion 60 which is an upper post connected to the microstructure 22, and middle portion 58 which is a cantilever arm 26 connected between the corresponding lower and upper posts. Preferably, the two legs 52 and 54 support diagonal opposite corners of the microstructure 22.

Preferably, each of the dielectric layers 6, 9, 12 and 16 is made of a material selected from the group consisting of $Si_3N_4$ and $SiO_2$, and has a thickness of about a fraction of 1 $\mu m$ to a few $\mu m$s. Preferably, each of the electrically conductive layers 8 and 15 is made of a material selected from the group consisting of Al, Au, Ti and V, and is formed of patterned metal films having a thickness of about 0.1 $\mu m$. Preferably, the predetermined distance between the microstructure 22 and the substrate layer 1 is of about 1 to a few $\mu m$s.

The microstructure 22 has an underside 27, a top side 28 opposite to the underside 27 and a sensing layer 13 lying between the underside 27 and the top side 28. The sensing layer 13 is responsive to temperature changes caused by absorbed infrared radiation. The upper dielectric layer 16 lies over the sensing layer 13 and the lower dielectric layer 12 lies under it. The lower dielectric layer 12 in combination with the upper dielectric layer 16 embeds the sensing layer 13.

The sensing layer 13 is made of a material exhibiting a substantially high temperature coefficient of resistivity. Preferably, this sensing layer 13 has a thickness of about 0.1 to 0.5 $\mu$m. Preferably, the material exhibiting a substantially high temperature coefficient of resistivity is selected from the group consisting of $VO_2$, $V_2O_3$ and a-Si, whereby the microbridge structure forms an uncooled infrared bolometric detector.

Preferably, a radiation-reflecting mirror 3 is provided on the substrate layer 1. The mirror 3 is a thin film infrared-reflecting mirror located on the substrate layer 1 directly beneath the microstructure 22. This mirror 3 serves to reflect infrared radiation which is not absorbed on its first passage through the uncooled infrared bolometric detector back into the microstructure 22 for additional absorption. The microstructure 22 with the embedded sensing layer 13 which is a $VO_2$ thermistor may be ideally spaced from the mirror 3 by one-quarter of the wavelength of the centre of the infrared spectral band of interest, to gain resonant performance. In more practical cases, however, the spacing may be determined by processing or other concerns.

Preferably, the micro support 23 is generally a multi layer structure. The lower portion 56 and the cantilever arm 26 of each leg of the micro support 23 comprise the two dielectric layers 6 and 9 and the electrically conductive metal layer 8. The upper portion 60 of each leg of the micro support 23 comprises the two dielectric layers 12 and 16 and the electrically conductive layer 15. Each of the leg of the micro support 23 is provided with an access 7 etched in the dielectric layer 6 to provide electrical connection between the electrically conductive layer 8 and the corresponding contact 2 of the substrate layer 1. Each of the leg of the micro support is also provided with an access 14 etched in the dielectric layers 9 and 12 to provide electrical connection between the electrically conductive layers 8 and 15. The electrically conductive layer 15 of each leg is connected to the corresponding electrical contact 50 the microstructure 22. The electrically conductive metal layers 8 and 15 of each leg of the micro support constitute an electrically conductive path between the substrate layer 1 and the microstructure 22.

The dielectric layers 6, 9, 12 and 16 provide good thermal isolation to the microstructure 22 due to a relatively low thermal conductivity of the dielectric materials. These dielectric layers 6, 9, 12 and 16 can be optimized to provide a solid support for the microstructure 22 and to isolate the microstructure thermally. They may also be chosen to be optimally compatible with manufacturing methods used. They protect the encapsulated metal layers 8 and 15 which provide an electrical contact between the sensor layer 13 and the electrical contacts 2 of the substrate layer 1. Since the dielectric layers 6, 9, 12 and 16 provide sufficient mechanical support for supporting the microstructure 22, the metal layers 8 and 15 can be optimized strictly from electrical and thermal points of view.

In a different embodiment, the micro support 23 may only consist of electrically conductive layers. However, in this case, the material of these layers not only have to be optimized strictly from electrical and thermal points of view, but also from the mechanical point of view. In this case, the electrically conductive layers must provide a mechanical support to the microstructure 22. The material of the layers must also be fully compatible with the microstructure fabrication process. Other combinations of dielectric and electrically conductive layers are also possible to form the micro support.

Figure 4:
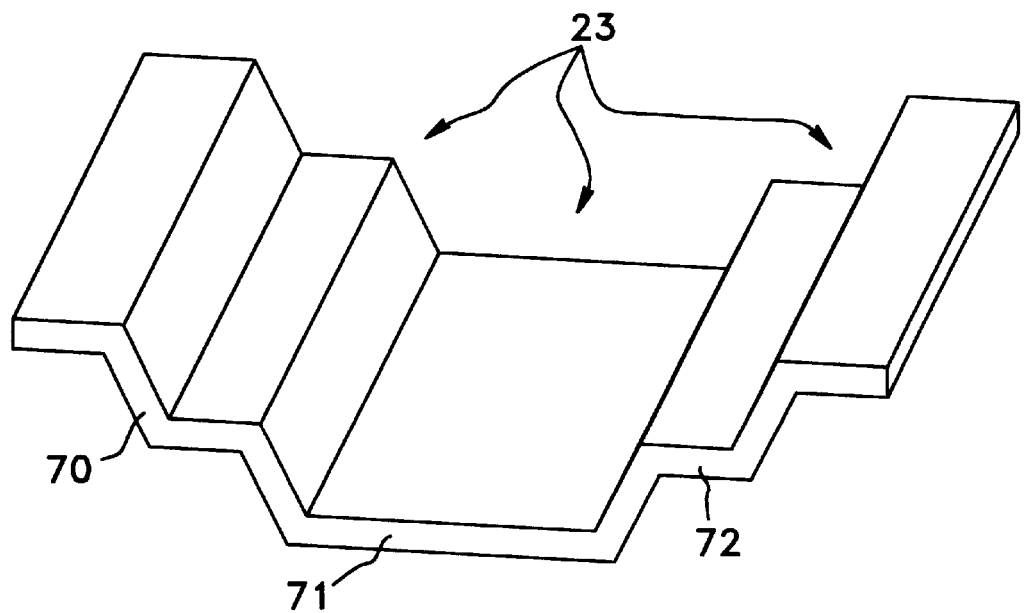
Figure 5:
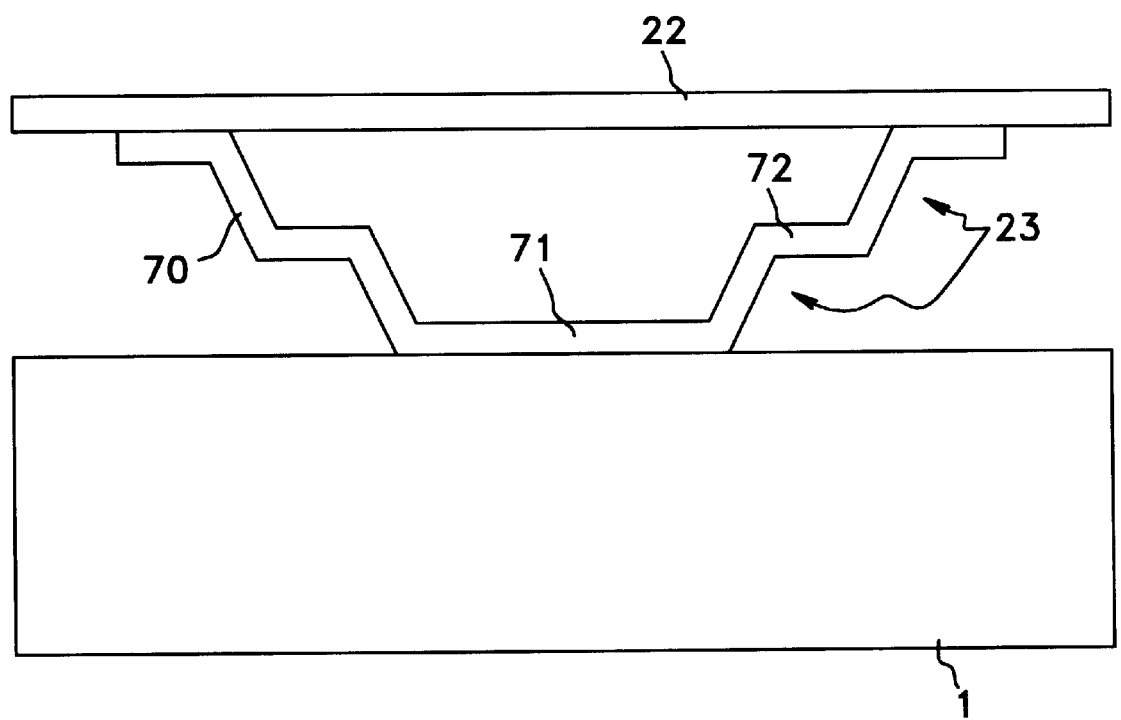

Referring now to FIGS. 4 and 5, there is shown a preferable embodiment of the micro support 23. It has a generally V-shaped body with a given width. The V-shaped body has a lower foot 71 connected to the substrate layer 1 and two lateral arms 70 and 72 extending upwardly from the lower foot 71 to the microstructure 22 for supporting it with respect to the substrate layer 1. Each of the lateral arms 70 and 72 is shaped as a staircase.

Figure 6:
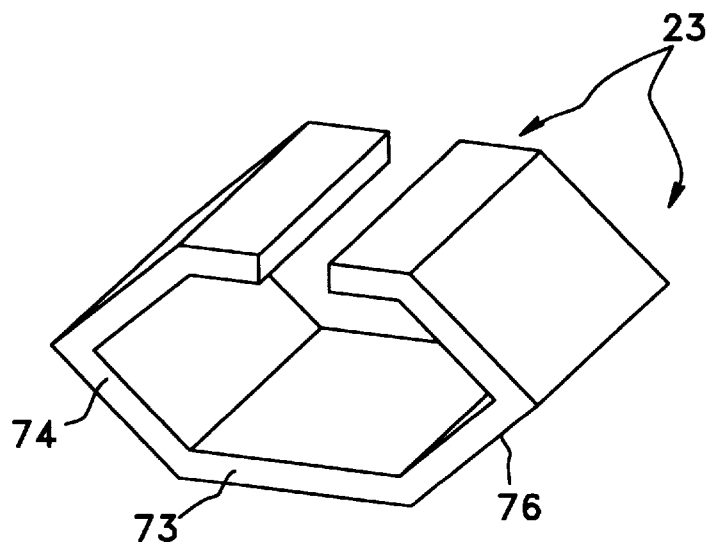
Figure 7:
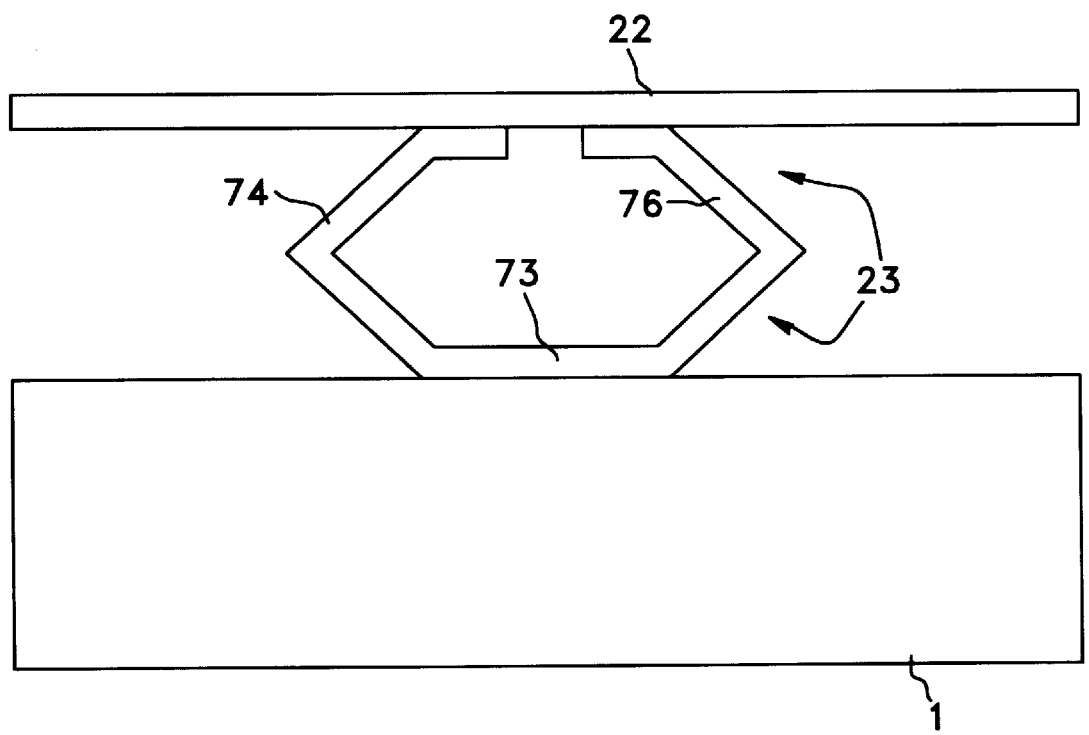

Referring now to FIGS. 6 and 7, there is shown another preferable embodiment of the micro support 23. It has a hexagonal shaped body with a given width. The hexagonal shaped body having a lower foot 73 connected to the substrate layer 1 and two lateral arms 74 and 76 extending upwardly from the lower foot 73 to the microstructure 22 for supporting it with respect to the substrate layer 1.

Figure 8:
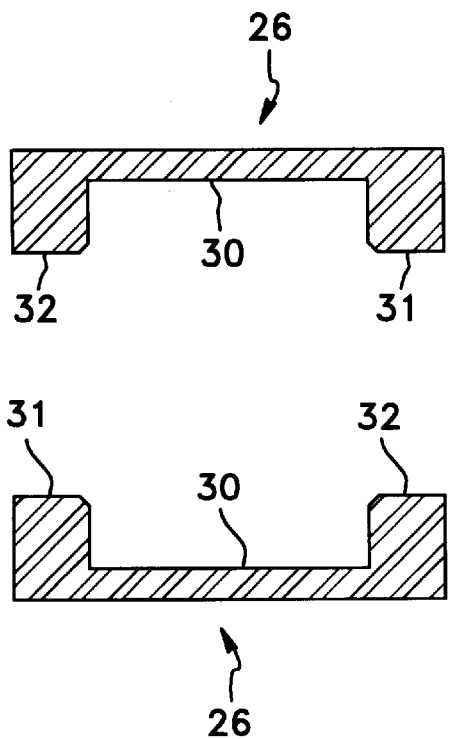
Figure 9:
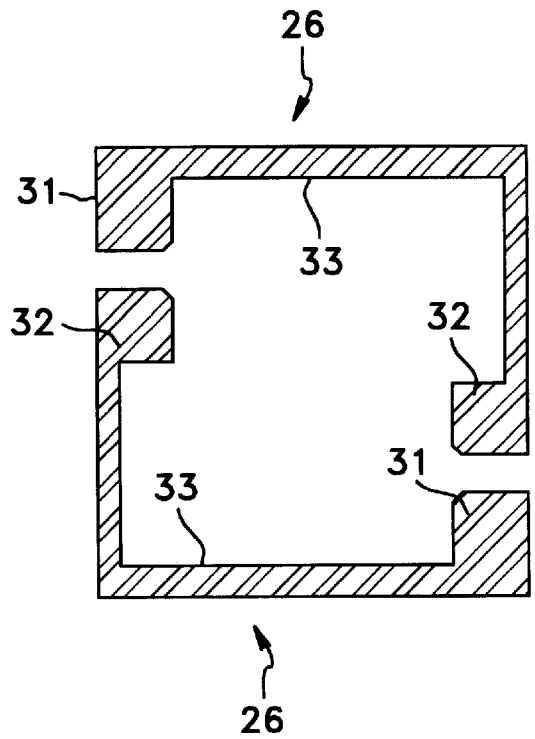
Figure 10:
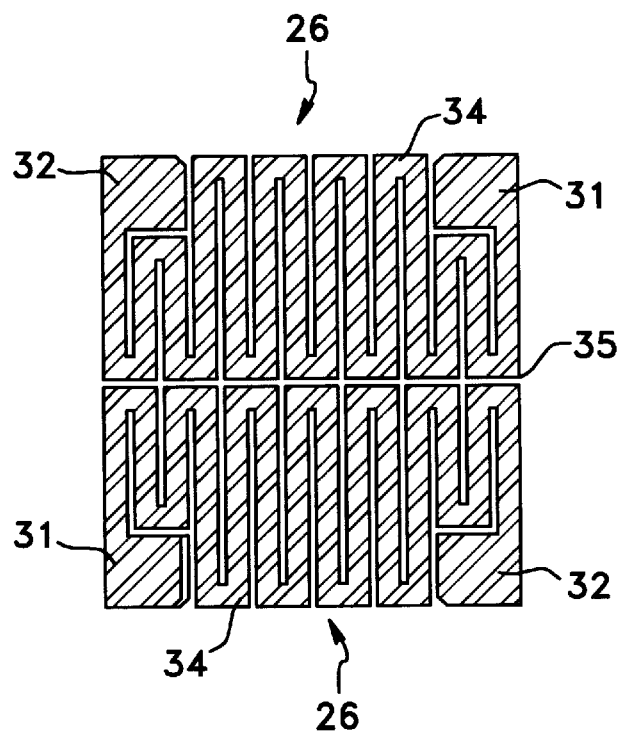

Referring now to FIGS. 8, 9 and 10, there are shown top views of different preferable embodiments of the cantilever arms 26 of the middle portions of a micro support different from the one shown in FIGS. 2, 3 and 22.

In the embodiment shown in FIG. 8, each cantilever arm 26 has an elongated straight section 30 terminated by enlarged ends 31 and 32 which form pads. The pads provide bases for the corresponding lower and upper portions of the micro support.

In the embodiment shown in FIG. 9 each cantilever arm 26 has a section 33 following the contour of a square microstructure (not shown) and is terminated by enlarged ends 31 and 32 which form pads. In the present case the sections 33 are L-shaped sections 33 that are longer than the straight sections 30 shown in FIG. 8 which provides a longer thermal path and thus a better thermal isolation to the microstructure.

In the embodiment shown in FIG. 10 each cantilever arm 26 has a zigzag section 34 terminated by enlarged ends 31 and 32 which form pads. The zigzag sections are adjacent, are separated by an elongated gap that is smaller than the wavelength of the radiation to be detected, and form a reflecting surface for reflecting the radiation back toward the sensing layer. In this embodiment, the cantilever arms 26 consist of sections 34 that are longer than the ones shown in FIGS. 8 and 9. In addition to providing a better thermal isolation to the microstructure, the cantilever arms 26 of FIG. 10 may serve as a reflecting surface for infrared radiation, providing that the width of slots 35 is smaller than the wavelength of radiation, thus replacing the thin film infrared reflecting mirror 3 shown in FIG. 22. As does the substrate mirror 3, the reflecting cantilever arms 26, shown in FIG. 10, may serve to reflect infrared radiation which is not absorbed on its first passage through the bolometric detector back into the microstructure for additional absorption.

By selecting a proper distance between the cantilever arms and the microstructure, the resonant performance can be gained for a spectral band of interest. Contrary to the substrate mirror 3 shown in FIG. 22 which planarity and thus the performance strongly depend on the surface topography of the substrate layer onto which the mirror is mounted, the planarity of the reflecting cantilever arms 26 of FIG. 10 shows a much smaller dependence on the topography of substrate layer 1 shown in FIG. 22.

Referring now to FIGS. 11 to 22, we will now describe a preferable method for forming the microbridge structure shown in FIGS. 2 and 3. FIGS. 11 to 22 are side elevational view along lines A—A of the microbridge structure of FIG. 2 as it is being formed. One will understand that even though only one side of the microbridge structure is shown in FIGS. 11 to 22 as it is being formed, the same process occurs on the other side of the microbridge structure. Also, the following method is preferable in that, among other aspects, the micro support comprises dielectric layers. Such layers are not essential in that the micro support can be made only of electrically conductive material.

Figure 11:
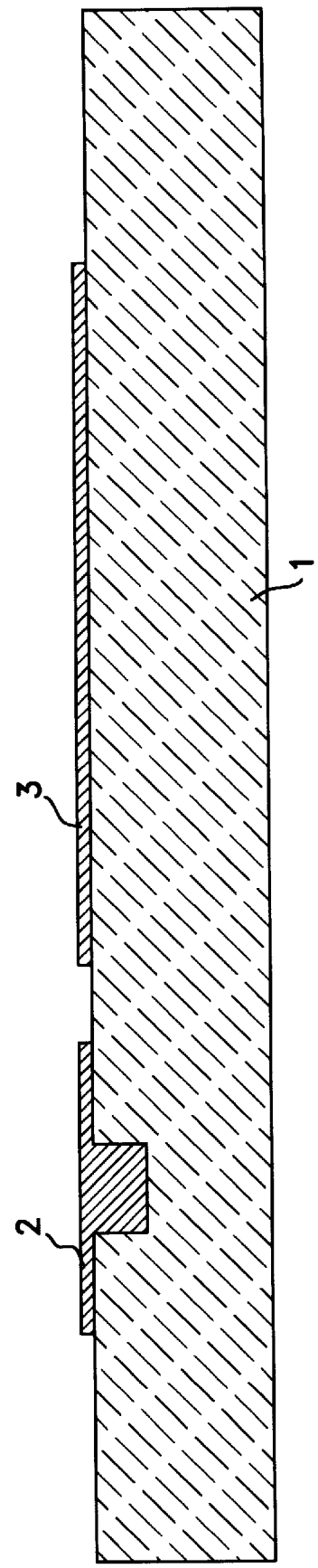

Referring now to FIG. 11, the method comprises the step (a) of providing the substrate layer 1 with two electrical contacts 2. Preferably, the substrate layer 1 is also provided with a radiation-reflecting mirror 3. The radiation-reflecting mirror 3 has a reflecting surface that faces the underside of the microstructure 22 as shown in FIG. 2. The radiation reflecting mirror 3, which is an infrared reflecting layer, is deposited and then reticulated in order to define a geometrical form. The two electrical contacts 2 are connected to readout electronics (not shown) embedded in the substrate layer 1.

Figure 12:
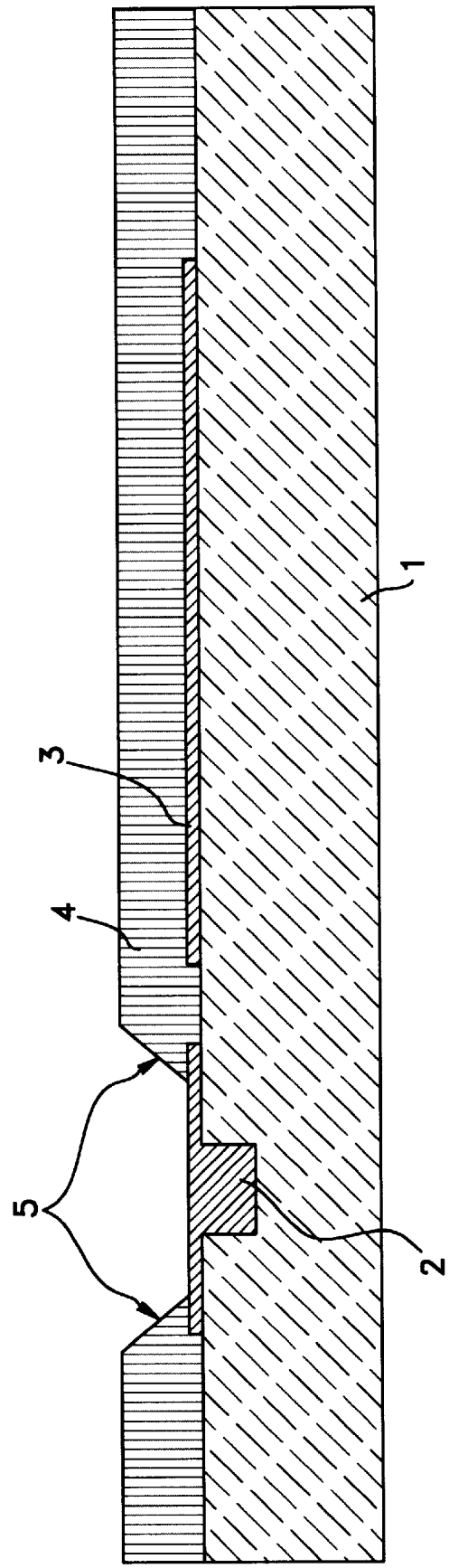

Referring now to FIG. 12, there is illustrated step (b) of the method which includes covering the substrate layer 1 with a temporary layer 4, and patterning and etching cavities 5 in the temporary layer 4 to provide accesses to the two electrical contacts 2 of the substrate layer 1.

In this step (b), preferably, a polyimide temporary 20 layer 4 with a thickness of one to three $\mu$ms is deposited on the substrate layer 1 by means of a spin coating method. The polyimide temporary layer 4 is subsequently baked to ensure its stability at elevated temperatures. Different materials for the temporary layer 4, such as glass, $SiO_2$ and Si may be used. The temporary layer 4 can be removed by means of an isotropic wet or dry etching which should not cause any damage to microstructure to be built in future steps. The cavities 5 are also for containing lower portions 56 of the legs of the micro support 23 shown in FIG. 3. Each of the cavities 5 has a lower end opened out onto the electrical contacts 2 of the substrate layer 1. The cavities 5 have perpendicular or sloped walls with proper dimensions and are fabricated in the polyimide temporary layer 4 by means of a combination of a standard photolithographic process and a reactive ion etching process known as the RIE process.

Figure 13:
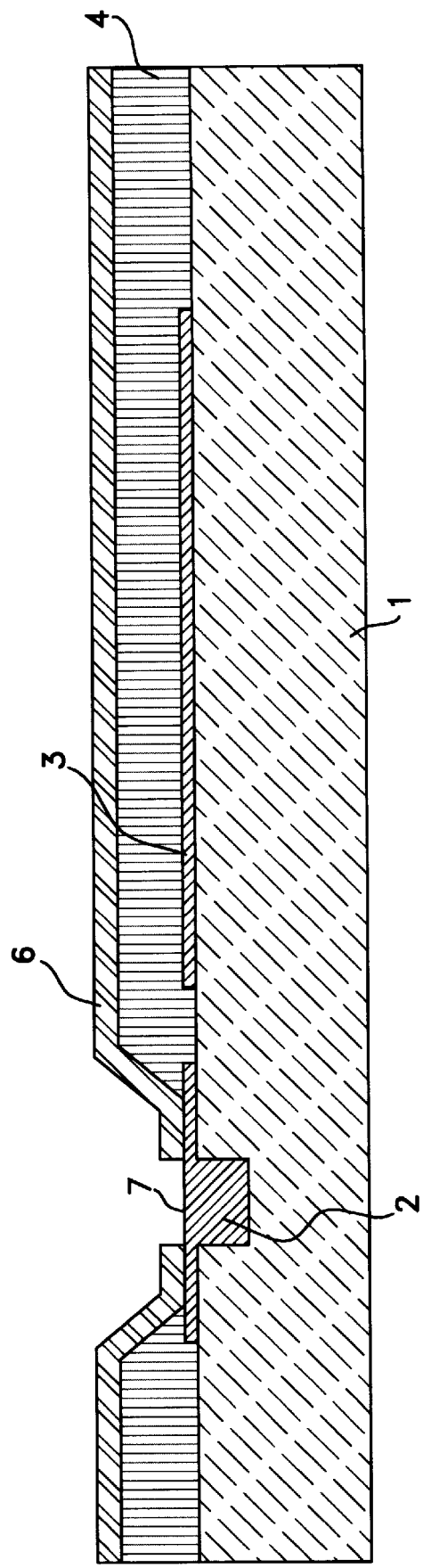

Referring now to FIG. 13, there are illustrated preferable actions of step (b), which comprises, after the patterning and etching of the first cavities 5 in the temporary layer 4, a step of covering the layers of the steps (a) to (b) with a dielectric layer 6, and patterning and etching the dielectric layer 6 to provide accesses 7 to the electrical contacts 2 of the substrate layer 1. Preferably, the dielectric layer 6 is deposited by means of a plasma enhanced chemical vapour deposition technique known as the PECVD technique. The dielectric layer 6 will be part of the lower and middle portions 56 and 58 of the legs of the micro support 23 shown in FIG. 3. The accesses 7 to the electrical contacts 2 of the substrate layer 1 are made in the dielectric layer 6 by means of the combination of a standard photolithographic process and the RIE process.

Figure 14:
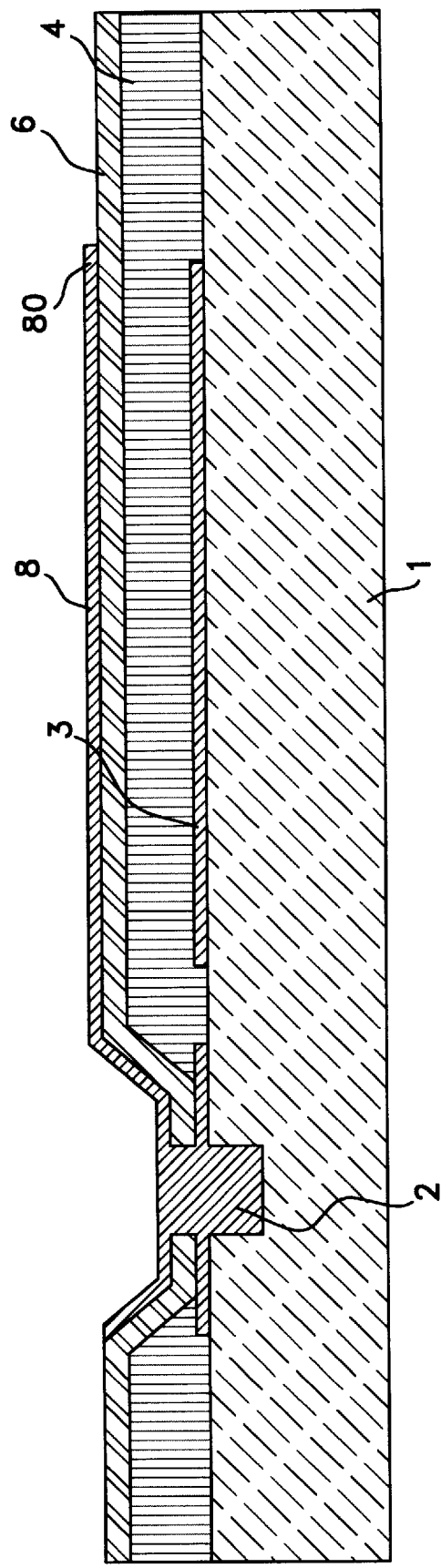

Referring now to FIG. 14, there is illustrated step (c) of the method which includes covering the layers of the previous steps (a) to (b) with an electrically conductive layer 8, and patterning and etching the electrically conductive layer 8 to provide two first electrically conductive paths extending respectively from the two electrical contacts 2 to the two electrical contacts 80. The electrically conductive layer 8 is also a part of the lower and middle portions of the legs of the micro support 23 shown in FIG. 3. This layer 8 is deposited by means of vacuum evaporation or sputtering. It is reticulated by means of a lift-off process or by means of a dry or wet etching processes.

Figure 15:
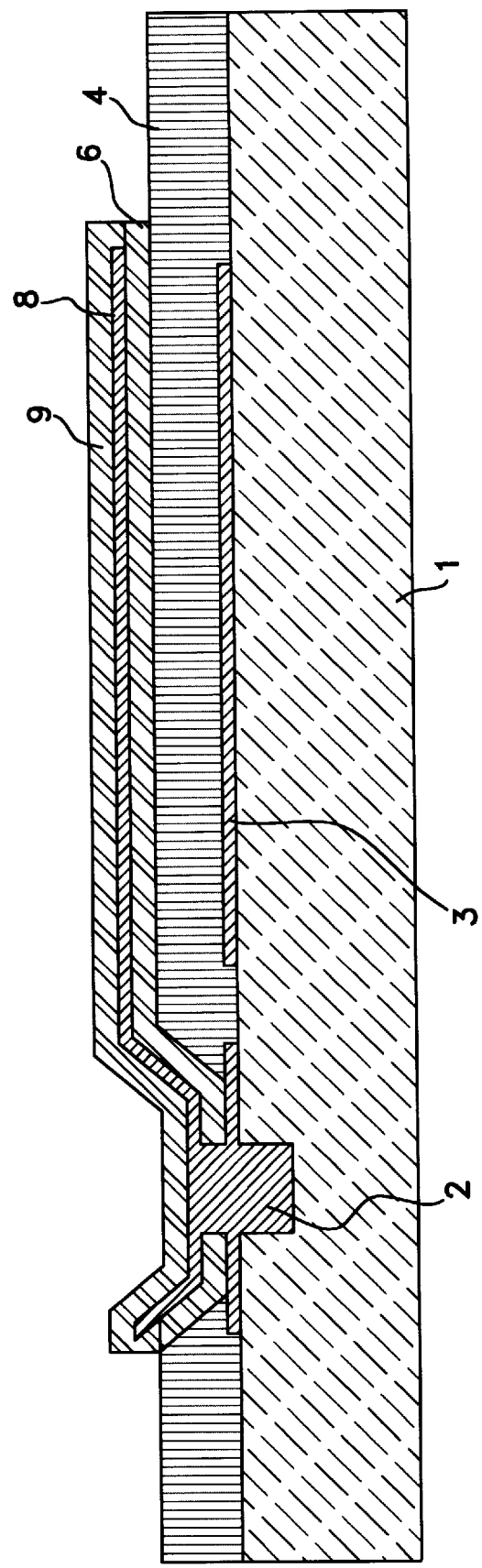

Referring now to FIG. 15, there are illustrated preferable actions of step (c), which comprises, after the patterning and etching of the electrically conductive layer 8, a step of covering the layers of the steps (a) to (c) with a dielectric layer 9, and patterning and etching the dielectric layers 6 and 9 to embed the electrically conductive layer 8 except for contacts with the two electrical contacts 2. The lower and middle portions 56 and 58 of the legs of the micro support 23 shown in FIG. 3 include the dielectric layers 6 and 9. The second dielectric layer 9 is deposited using the PECVD technique and the dielectric layers 6 and 9 are etched using the RIE technique.

Figure 16:
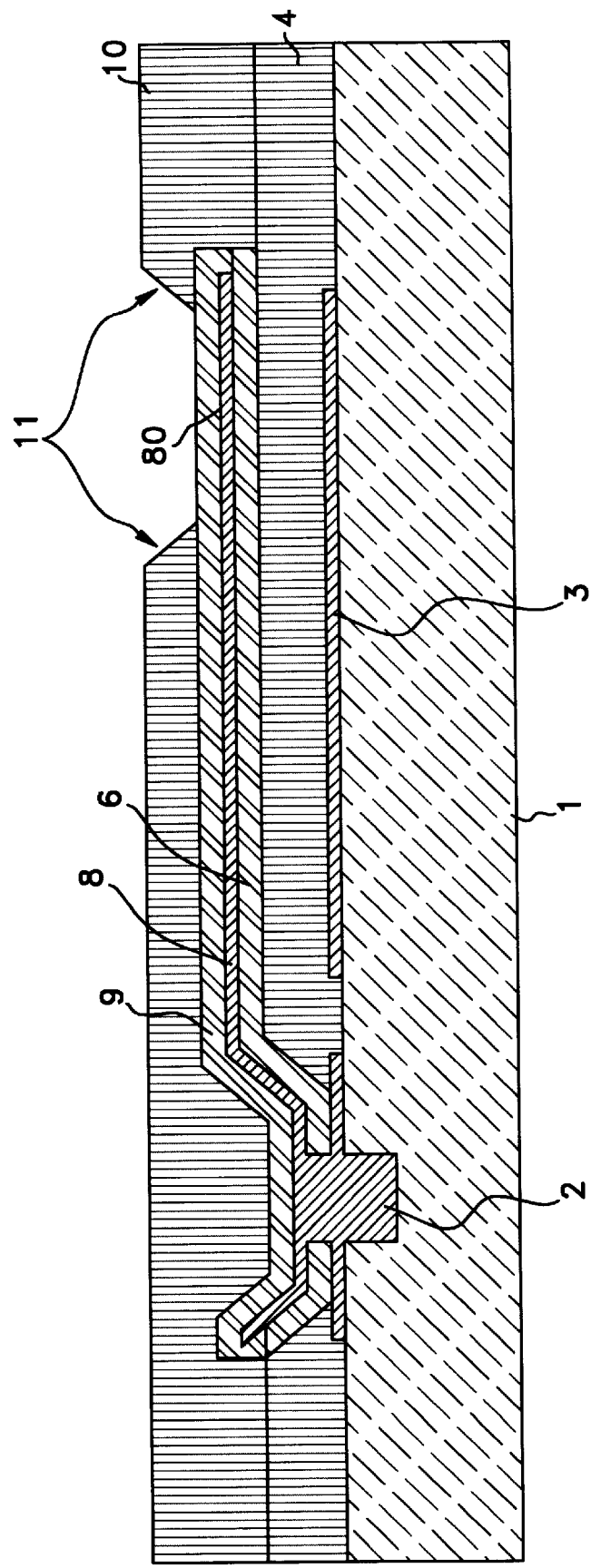

Referring now to FIG. 16, there is illustrated step (d) of the method which includes covering the layers of the previous steps (a) to (c) with a temporary layer 10, and patterning and etching cavities 11 in the temporary layer 10 to provide accesses to the two electrical contacts 80. For the moment complete accesses to the contacts 80 are not possible because of the presence of the dielectric layer 9 but this layer will be eventually etched to provide complete accesses. Each of the cavities 11 has a lower end opened out onto a section of the dielectric layer 9. The cavities 11 are also for containing upper portions 60 of the legs of the micro support 23 shown in FIG. 3.

Figure 17:
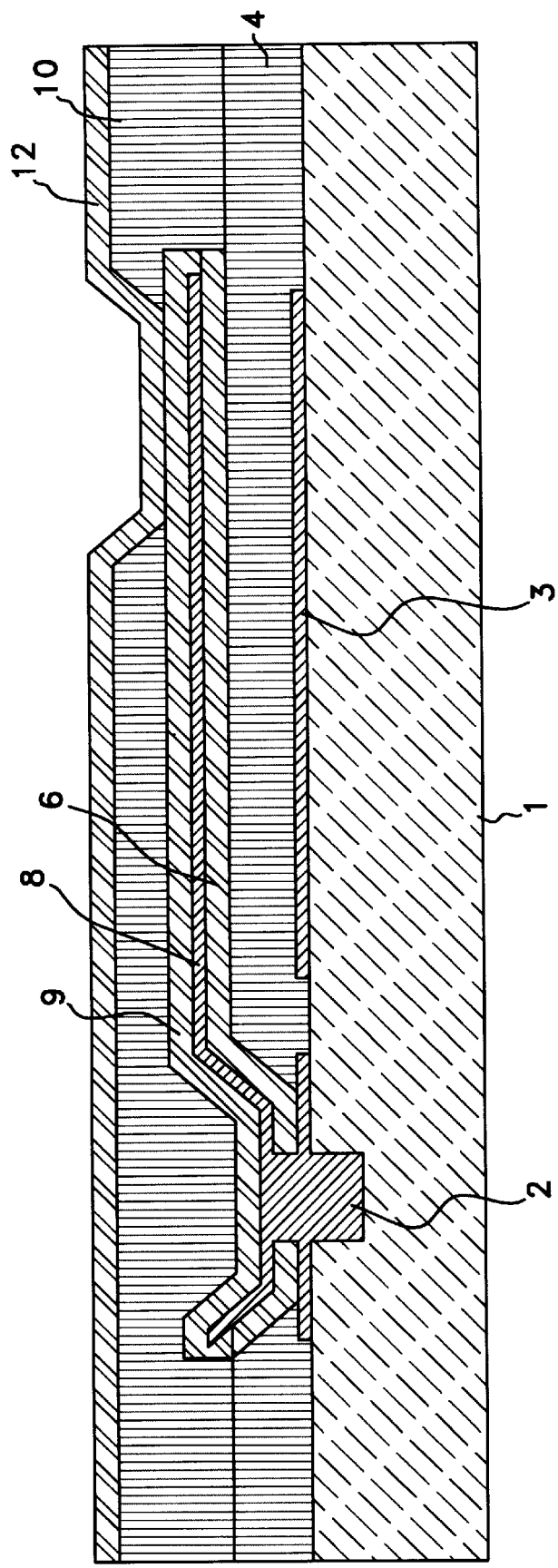

Referring now to FIG. 17, there are illustrated preferable actions of step (d), which comprises, after the patterning and etching of the cavities 11 in the temporary layer 10 of FIG. 16, a step of covering the layers of the steps (a) to (d) with a dielectric layer 12. This layer 12 will be part of the upper portions 60 of the legs of the micro support 23 shown in FIG. 3, and part of the microstructure 22 as shown in FIG. 22. The dielectric layer 12 is deposited by means of the PECVD technique.

Figure 18:
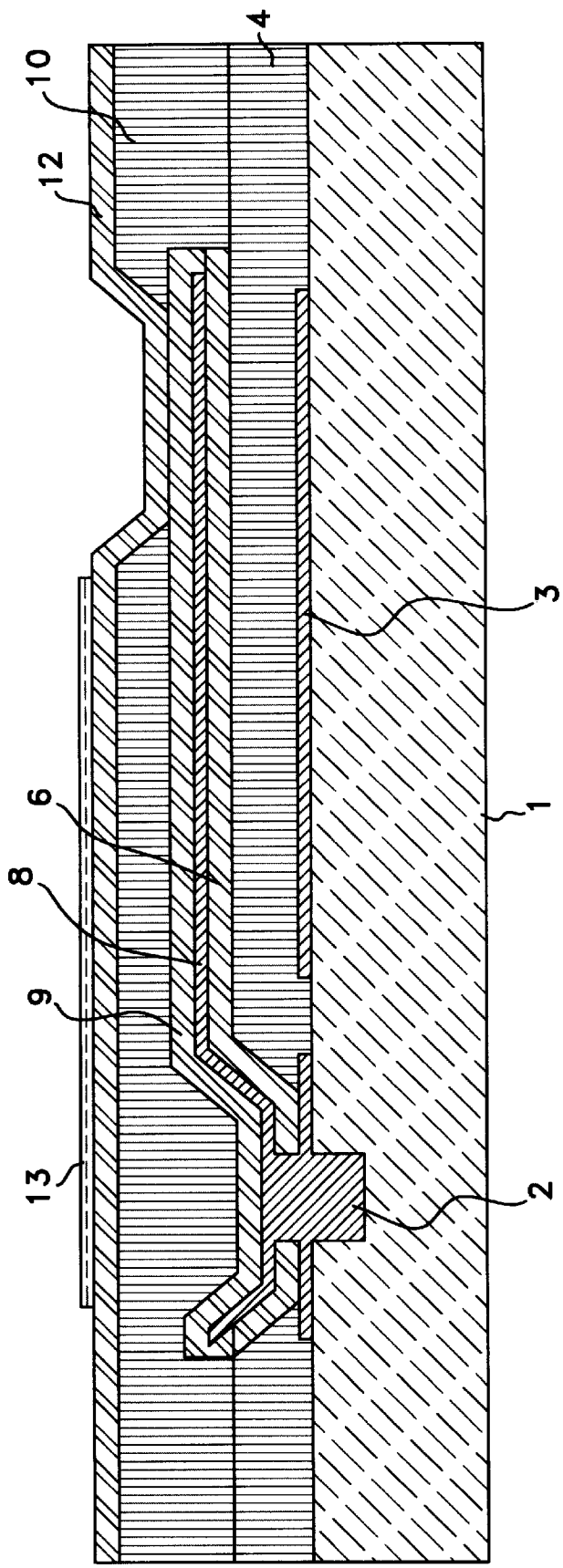

Referring now to FIG. 18, there is illustrated step (e) of the method which includes covering the layers of the previous steps (a) to (d) with a sensing layer 13, and patterning and etching the sensing layer 13 to define a sensing area extending generally over the electrically conductive path. Preferably, the sensing layer 13 is a $VO_2$ layer deposited by means of a reactive sputtering technique and then reticulated to define the sensing area by means of the combination of a standard photolithographic process and RIE process. However, any other material with appropriate sensing properties such as $V_2O_3$ or a-silicon can be used.

Figure 19:
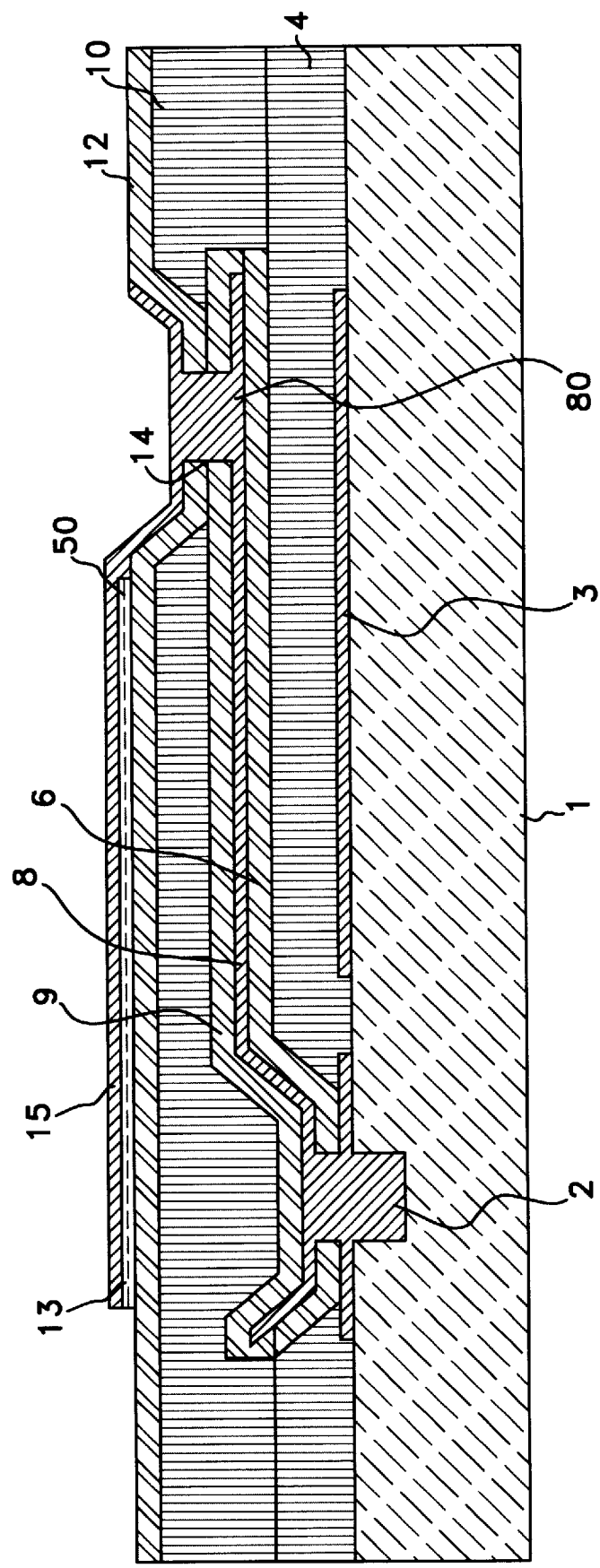

Referring now to FIG. 19, there are illustrated preferable actions of step (e), which comprises, after the patterning and etching of the sensing layer 13, a step of patterning and etching the dielectric layers 9 and 12 to provide accesses 14 to the two electrical contacts 80. The accesses 14 are made by means of the RIE technique combined with the standard photolithographic process.

Still referring to FIG. 19, there is illustrated step (f) of the method which includes covering the layers of the previous steps (a) to (e) with an electrically conductive layer 15, and patterning and etching the electrically conductive layer 15 to provide two second electrically conductive paths extending respectively from the two first electrical paths via the two electrical contacts 80 to electrical contacts 50 of the sensing area. The second electrically conductive paths are forming upper portions 60 of the legs of the micro support 23 shown in FIG. 3. The electrically conductive layer 15, in combination with the electrically conductive layer 8, provide through each leg of the micro support an electrically conductive path from the sensing layer 13 to the corresponding electrical contact 2 of the substrate layer 1. The second electrically conductive layer 15 is deposited by means of vacuum evaporation or sputtering. It is reticulated by means of a lift-off process or by means of a dry or wet etching processes. The electrically conductive layer 15 is at the same time part of the microstructure 22 shown in FIG. 2 and of the micro support 23 shown in FIG. 3.

Figure 20:
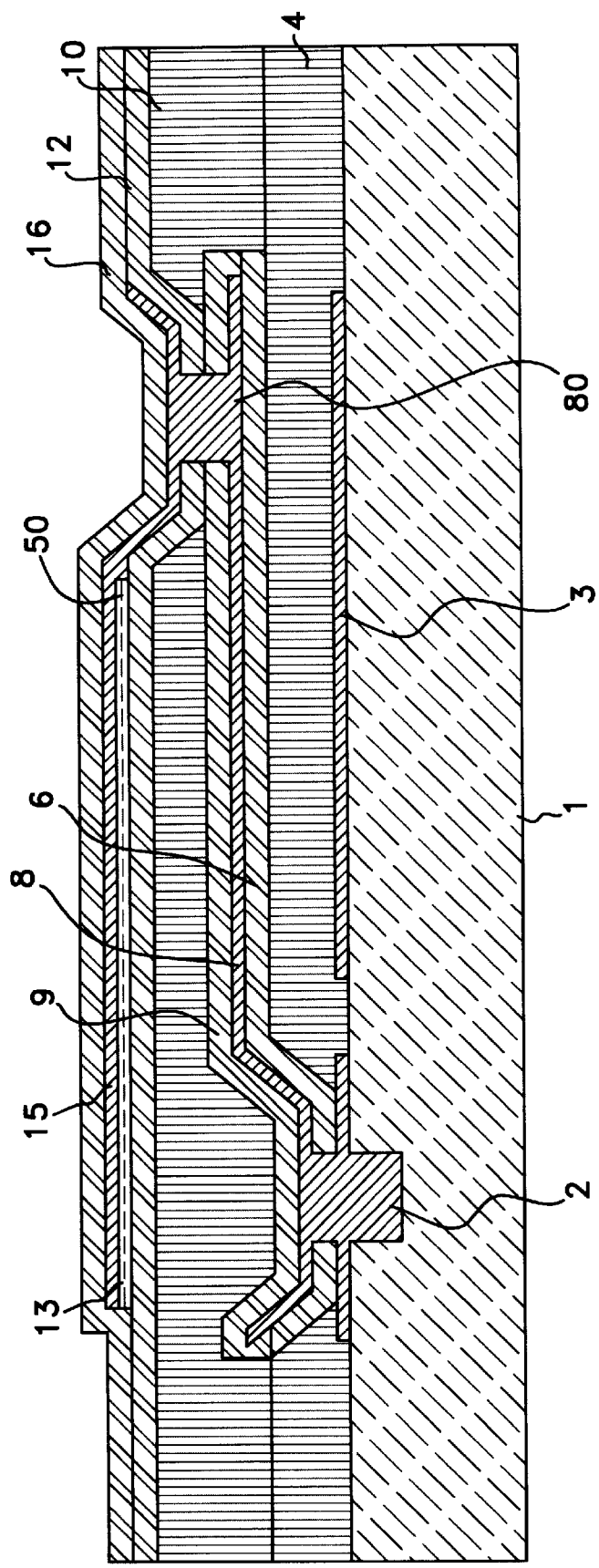

Referring now to FIG. 20, there are illustrated a preferable action of step (f), which comprises, after the patterning and etching of the electrically conductive layer 15, a step of covering the layers of steps (a) to (f) with a dielectric layer 16 to embed the sensing area and the electrically conductive layer 15 except for contacts with the electrical contacts 80. The dielectric layer 16 is deposited by means of the PECVD technique.

Figure 21:
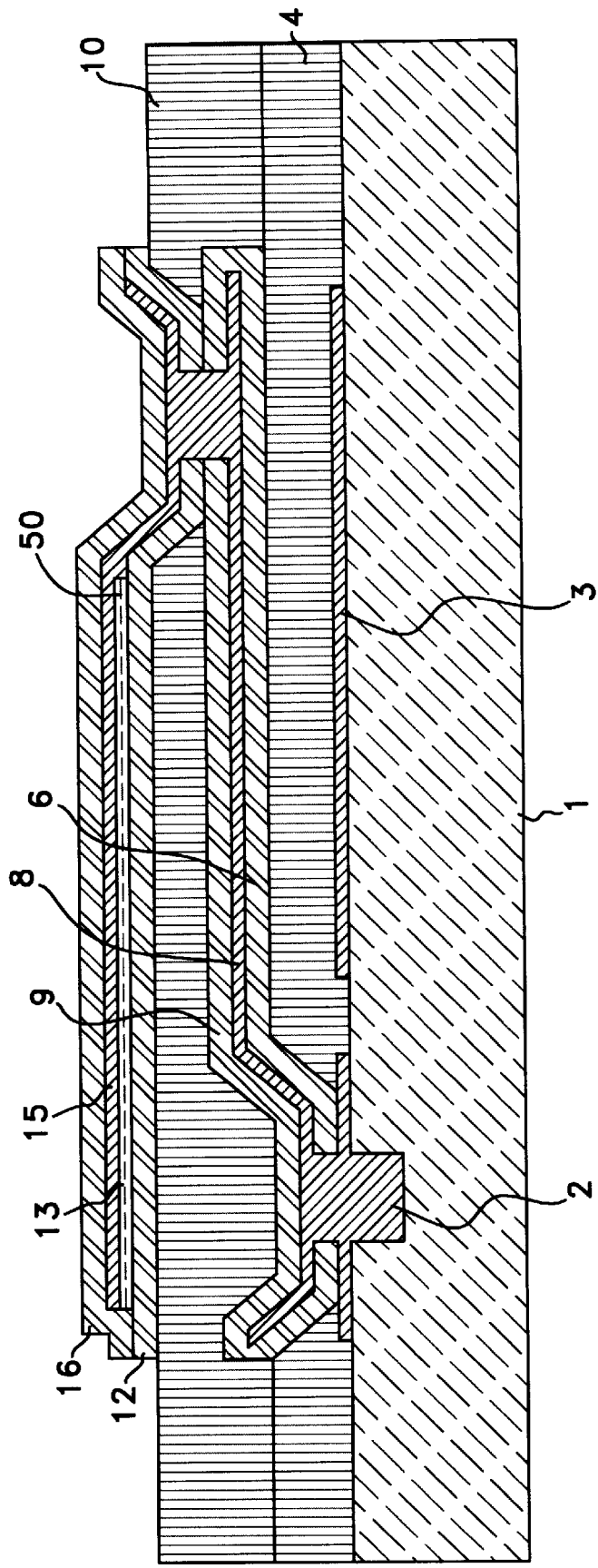

Referring now to FIG. 21, there is illustrated preferable actions of step (f), which comprises patterning and etching the dielectric layers 12 and 16 to shape the microstructure 22 and the upper portions 60 of the legs of the micro support 23 as shown in FIGS. 2 and 3. The dielectric layers 12 and 16 are reticulated down to the polyimide temporary layer 10. This is done by combining a standard photolithographic process with the RIE technique.

Referring now to FIG. 22, there is illustrated step (g) of the method which includes removing the temporary layers 4 and 10 shown in FIG. 21 to reveal the micro support 23 which extends generally underneath the microstructure 22, between the microstructure 22 and the substrate layer 1 as shown in FIG. 2. The temporary polyimide layers 4 and 10 are removed by an oxygen plasma etching process.

The parameters of the microstructure described herein may be further optimized. For example, the arrangement of some layers in the microstructure may well be revised so that, for a particular application, the fabrication process can be simplified or the performance of the microstructure can be improved. While this invention has been described with reference to illustrative embodiments, this description is not intended to be construed to a limiting sense. Various modifications or combinations of the illustrative embodiments, as well as other embodiments of the invention, will be apparent to persons skilled in the art upon reference to the description. It is therefore intended that the described invention encompasses any such modifications or embodiments.

What is claimed is:

1. A microbridge structure comprising:
    a substrate layer provided with two first electrical contacts;
    a microstructure including a sensing area provided with two second electrical contacts; and
    a micro support for suspending the microstructure over and at a predetermined distance from the substrate layer, the micro support having at least one leg comprising two electrically conductive paths each made of an electrically conductive layer, the two electrically conductive paths connecting respectively the two first electrical contacts of the substrate layer to the two second electrical contacts of the microstructure, said at least one leg comprising dielectric layers embedding the corresponding electrically conductive layer, each leg having a lower foot connected to the substrate layer and a lateral arm extending upwardly from the lower foot to the microstructure for supporting the microstructure with respect to the substrate layer.

2. A microbridge structure according to claim 1, wherein said at least one leg comprises two legs each including lower, middle and upper portions, the lower portions of the legs projecting respectively upwardly from the two first electrical contacts to first intermediate positions between the substrate layer and the microstructure, the upper portions of the legs projecting respectively downwardly from the two second electrical contacts to second intermediate positions between the substrate layer and the microstructure, the middle portions of the legs extending between the first and second intermediate positions as cantilevers to connect respectively the corresponding lower and upper portions, the two legs comprising respectively the two electrically conductive paths.

3. A microbridge structure according to claim 2, wherein each of the middle portions has an elongated straight section terminated by enlarged ends.

4. A microbridge structure according to claim 2, wherein each of the middle portions has a section following a contour of the microstructure and is terminated by enlarged ends.

5. A microbridge structure according to claim 2, wherein each of the middle portions has a zigzag section terminated by enlarged ends.

6. A microbridge structure according to claim 2, wherein each of the legs further comprises dielectric layers embedding the electrically conductive layer that connects the corresponding first and second electrical contacts.

7. A microbridge structure according to claim 2, wherein the lower and upper parts of each leg are substantially shaped as an upside down hollow truncated pyramid.

8. A microbridge structure according to claim 2, wherein the two legs support diagonal opposite corners of the microstructure.

9. A microbridge structure according to claim 1, wherein each of the dielectric layers is made of a material selected from the group consisting of $Si_3N_4$ and $SiO_2$, and has a thickness of about a fraction of 1 $\mu$m to a few $\mu$ms.

10. A microbridge structure according to claim 1, wherein each of the electrically conductive layer is made of a material selected from the group consisting of Al, Au, Ti and V, and is formed of a patterned metal film having a thickness of about 0.1 $\mu$m.

11. A microbridge structure according to claim 1, wherein the predetermined distance between the microstructure and the substrate layer is of about 1 to a few $\mu$ms.

12. A microbridge structure according to claim 1, wherein said at least one leg comprises two legs forming a generally V-shaped body with a given width, the V-shaped body having a lower foot connected to the substrate layer and two lateral arms extending upwardly from the lower foot to the microstructure for supporting the microstructure with respect to the substrate layer.

13. A microbridge structure according to claim 1, wherein said at least one leg comprises two legs forming a hexagonal shaped body with a given width, the hexagonal shaped body having a lower foot connected to the substrate layer and two lateral arms extending upwardly from the lower foot to the microstructure for supporting the microstructure with respect to the substrate layer.

14. A microbridge structure according to claim 1, further comprising a radiation-reflecting mirror provided on the substrate layer.

15. A microbridge structure according to claim 1, herein the micro support extends substantially entirely underneath the microstructure, between the microstructure and the substrate layer.

16. A microbridge structure according to claim 1, wherein the sensing area includes a sensing layer made of a material selected from the group consisting of $VO_2$, $V_2O_3$ and a-Si, and having a thickness of about 0.1 to 0.5 $\mu$m, whereby the microbridge structure forms an uncooled infrared bolometric detector.

17. A microbridge structure according to claim 5, wherein:

the sensing area includes a sensing layer having characteristics for sensing a radiation with a given wavelength; and the zigzag sections are adjacent, are separated by an elongated gap that is smaller than the wavelength of the radiation, and form a reflecting surface for reflecting the radiation back toward the sensing layer.

18. A microbridge structure according to claim 12, wherein each of the lateral arms is shaped as a staircase.

19. A method for forming a microbridge structure comprising microstructure suspended from a substrate layer by a micro support, the method comprising steps of:

(a) providing the substrate layer with two first electrical contacts;

(b) covering the substrate layer with a first temporary layer, patterning and etching first cavities in the first temporary layer to provide accesses to the two first electrical contacts of the substrate layer, covering the layers of the steps (a) to (b) with a first dielectric layer, and patterning and etching the first dielectric layer to provide accesses to the first electrical contacts of the substrate layer;

(c) covering the layers of the previous steps (a) to (b) with a first electrically conductive layer; patterning and etching the first electrically conductive layer to provide two first electrically conductive paths extending respectively from the two first electrical contacts, the two first electrically conductive paths being parts of the micro support; covering the layers of the steps (a) to (c) with a second dielectric layer; and patterning and etching the first and second dielectric layers to embed the first electrically conductive layer except for contacts with the two first electrical contacts, the first and second dielectric layers being parts of the micro support;

(d) covering the layers of the previous steps (a) to (c) with a second temporary layer, patterning and etching second cavities in the second temporary layer to provide accesses to the two second electrical contacts, and covering the layers of the steps (a) to (d) with a third dielectric layer;

(e) covering the layers of the previous steps (a) to (d) with a sensing layer, patterning and etching the sensing layer to define a sensing area extending generally over the first electrically conductive paths, and patterning and etching the second and third dielectric layers to provide accesses to the two second electrical contacts;

(f) covering the layers of the previous steps (a) to (e) with a second electrically conductive layer; patterning and etching the second electrically conductive layer to provide two second electrically conductive paths extending respectively from the two first electrically conductive paths to two electrical contacts of the sensing area, the second electrically conductive paths being parts of the micro support; covering the layers of steps (a) to (f) with a fourth dielectric layer to embed the sensing area and the second electrically conductive layer except for contacts with the two second electrical contact; and patterning and etching the third and fourth dielectric layers to shape the microstructure and upper parts of the micro support; and (g) removing the first and second temporary layers to reveal the micro support which extends generally underneath the microstructure, between the microstructure and the substrate layer.

20. A method according to claim 19, wherein:

the step (b) further comprises, after the patterning and etching of the first cavities in the first temporary layer, a step of covering the layers of the steps (a) to (b) with a first dielectric layer, and patterning and etching the first dielectric layer to provide accesses to the first electrical contacts of the substrate layer;

the step (c) further comprises, after the patterning and etching of the first electrically conductive layer, a step of covering the layers of the steps (a) to (c) with a second dielectric layer, and patterning and etching the first and second dielectric layers to embed the first electrically conductive layer except for contacts with the two first electrical contacts, the first and second dielectric layers being parts of the micro support;

the step (d) further comprises, after the patterning and etching of the second cavities in the second temporary layer, a step of covering the layers of the steps (a) to (d) with a third dielectric layer;

the step (e) further comprises, after the patterning and etching of the sensing layer, a step of patterning and etching the second and third dielectric layers to provide accesses to the two second electrical contacts; and the step (f) further comprises, after the patterning and etching of the second electrically conductive layer, steps of:

covering the layers of steps (a) to (f) with a fourth dielectric layer to embed the sensing area and the second electrically conductive layer except for contacts with the two second electrical contact; and patterning and etching the third and fourth dielectric layers to shape the microstructure and upper parts of the micro support.

21. A method according to claim 19, wherein the step (a) further comprises a step of providing the substrate layer with a radiation-reflecting mirror.

* * * * *